US011656121B2

(12) United States Patent
Coffy et al.

(10) Patent No.: US 11,656,121 B2
(45) Date of Patent: May 23, 2023

(54) OPTICAL PACKAGE OF AN INTEGRATED CIRCUIT

(71) Applicant: STMicroelectronics (Grenoble 2) SAS, Grenoble (FR)

(72) Inventors: Romain Coffy, Voiron (FR); Younes Boutaleb, Grenoble (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 17/545,369

(22) Filed: Dec. 8, 2021

(65) Prior Publication Data

US 2022/0187123 A1 Jun. 16, 2022

(30) Foreign Application Priority Data

Dec. 11, 2020 (FR) ...................................... 2013045

(51) Int. Cl.
*G01J 1/42* (2006.01)
*H01L 31/18* (2006.01)
(52) U.S. Cl.
CPC ............ *G01J 1/4204* (2013.01); *H01L 31/18* (2013.01)
(58) Field of Classification Search
CPC ................................ G01J 1/4204; H01L 31/18
See application file for complete search history.

(56) References Cited

U.S. PATENT DOCUMENTS

2012/0248625 A1* 10/2012 Coffy .................... H01L 31/167
257/E23.145

FOREIGN PATENT DOCUMENTS

EP 2448001 A2 5/2012

OTHER PUBLICATIONS

INPI Search Report and Written Opinion for priority application, FR 2013045, report dated May 27, 2021, 10 pages.

* cited by examiner

*Primary Examiner* — Georgia Y Epps
*Assistant Examiner* — Don J Williams
(74) *Attorney, Agent, or Firm* — Crowe & Dunlevy

(57) ABSTRACT

An electronic chip supports an optical device and electric connection zones. An insulating coating coats the electronic chip, covers the electric connection zones and exposes the optical device. An optical plugging element is at least partly fastened onto a first face of the insulating coating and is optically coupled to the optical device. Vias pass through the insulating coating from its first face to a second face opposite to the first face. Inner walls of the vias support electrically conductive paths connected to the electric connection zones of the electronic chip by electrically conductive tracks arranged on the first face of the insulating coating. The electrically conductive paths of the vias further have ends protruding onto the second face of the insulating coating.

19 Claims, 3 Drawing Sheets

OPTICAL PACKAGE OF AN INTEGRATED CIRCUIT

PRIORITY CLAIM

This application claims the priority benefit of French Application for Patent No. 2013045, filed on Dec. 11, 2020, the content of which is hereby incorporated by reference in its entirety to the maximum extent allowable by law.

TECHNICAL FIELD

Embodiments and implementations relate to the field of microelectronics and, in particular, to the field of packaging integrated circuits and more particularly to the optical packages of integrated circuits.

BACKGROUND

Conventionally a package of an integrated circuit includes an electronic integrated circuit chip connected to electric connections of a support substrate by connecting wires better known by the usual term wire bonds.

The use of such connecting wires increases the size of the package.

When the electronic chip supports an optical device (such as a sensor or emitter, for example), one solution involves placing the chip and the connecting wires in a housing of a coating made of resin and placing an optical pad or element, for example made of glass, above the chip and the connecting wires and bearing on the edges of the housing.

However, such a solution increases the size of such an optical package.

In order to reduce this size it is possible to embed the connecting wires in a coating made of resin, to place the chip equipped with its optical device in a housing made in the coating and to place the optical pad above the chip.

However, such a solution requires the use of chips having a large size.

Such approaches limit the minimum size of the optical package, which is a disadvantage for the integration of such packages into apparatuses for which the bulk is a significant factor.

For example, the integration into telephones of the smartphone type of ambient light sensors (ALS) is at present limited by the size of the packages of this type of sensor.

There is therefore a need to even further reduce the size of an optical package of an integrated circuit.

SUMMARY

According to one aspect, an optical package of an integrated circuit is proposed.

This package comprises an electronic chip supporting an optical device, for example but not exclusively an ambient light sensor, and electric connection zones, for example known to a person skilled in the art by the name pads.

The package also includes an insulating coating, for example a resin, coating the chip, covering the electric connection zones and exposing the optical device.

The package also includes an optical plugging element, for example but not exclusively a pane of optically transparent material (such as a glass material), at least partly fastened onto a first face of the insulating coating, typically its upper face, and optically coupled to the optical device.

In this context, optically coupled means, for example, an optical cooperation between the optical plugging element and the optical device, in such a way as to, for example, let a luminous flux emanating from and/or intended for the optical device to pass through.

This optical cooperation can also include an optical filtering.

The package also includes vias passing through the coating from its first face to a second face, typically its lower face, opposite to the first face and having inner walls equipped with electrically conductive paths connected on the one hand to the electric connection zones of the chip by electrically conductive tracks arranged on the first face of the coating and having on the other hand protruding ends on the second face of the coating.

Thus, in such a package electric connections are made directly in and on the coating of the chip which allows to eliminate the need for conventional connecting wires (wire bonds) and thus to reduce the bulk with respect to a conventional package of the prior art.

Moreover, the coating is open to leave exposed the optical device of the chip, which allows to limit the size of the optical plugging element which will be able to bear on the edges of the opening, and thus contribute to obtaining a package having a reduced size.

Such a package could be directly fastened onto a printed circuit card or board, for example, via the protruding ends of the electrically conductive paths lining the vias, and these protruding ends can be equipped with solder balls.

That being said, it would be possible for, according to one embodiment, the package to further comprise a support substrate at least partly fastened onto the second face of the coating and having an interconnection network connected to said protruding ends of the electrically conductive paths.

In this case it is the support substrate, equipped with solder balls, for example, that would be fastened onto the printed circuit card.

According to one embodiment, the package comprises a material for fastening the optical plugging element including an electrically insulating glue located at least partly around the optical device.

And this bead of insulating glue can be disposed at least partly on the electrically conductive tracks of the first face of the coating without creating a short circuit.

According to one embodiment, the optical plugging element contains or supports an electrically conductive element and the material for fastening include at least two disjointed volumes of electrically conductive glue configured to connect two ends of the electrically conductive element onto electrically conductive tracks of the coating.

These tracks can thus be connected to a device configured to detect a possible breakage of the electrically conductive element or a detachment of the optical plugging element, and this device can be disposed in the chip itself or outside the package.

Thus, such a conductive element which is integrated into the optical plugging element allows to indicate that the optical plugging element is neither broken nor detached.

In particular, in a case in which the optical device comprises a laser source, a failure of the optical plugging element can damage the eyes of the observers; it is thus advantageous to know a state of integrity of the optical plugging element.

According to one embodiment, the optical plugging element is a pane of material, such as glass, which can be optically transparent or filtering or have various characteristics such as polarization, for example but not exclusively.

According to one embodiment, the optical device is a device that emits and/or receives a luminous flux.

According to one embodiment, the optical device is an ambient light sensor.

According to another aspect, a method for manufacturing an optical package of an integrated circuit is proposed, comprising: providing an electronic chip supporting an optical device and electric connection zones; forming a thermally degradable protective layer covering the optical device; forming an insulating coating of the chip while covering connection zones except for said protective layer; thermally degrading the protective layer so as to expose the optical device; creating vias passing through the coating from a first face to a second face opposite to the first face, and first patterns arranged on the first face of the coating and extending from the vias to the electric connection zones and second patterns on the second face of the coating extending from said vias; creating electrically conductive paths on the inner walls of the vias and electrically conductive tracks in the first patterns and the second patterns in such a way as to on the one hand electrically connect the electrically conductive paths to the electric connection zones of the chip and form on the other hand ends of the electrically conductive paths protruding onto the second face of the coating; and fastening an optical plugging element at least partly onto the first face of the coating or onto the electrically conductive paths, so as to allow an optical coupling between the optical plugging element and the optical device.

According to one embodiment, the creation of the vias and of the first and second patterns is carried out by a direct-structuring laser (for example, Laser Direct Structuring (LDS) techniques), and the creation of the electrically conductive paths, of the tracks and of the ends of the electrically conductive paths is carried out by electroless plating.

According to one embodiment, the method further comprises a fastening of a support substrate onto the second face of the coating including a connection of the protruding ends of the electrically conductive paths to an interconnection network of the support substrate.

BRIEF DESCRIPTION OF THE DRAWINGS

Other advantages and features of the invention will appear upon examination of the detailed description of implementations and embodiments, in no way limiting, and of the appended drawings in which.

DETAILED DESCRIPTION

Figure 1:
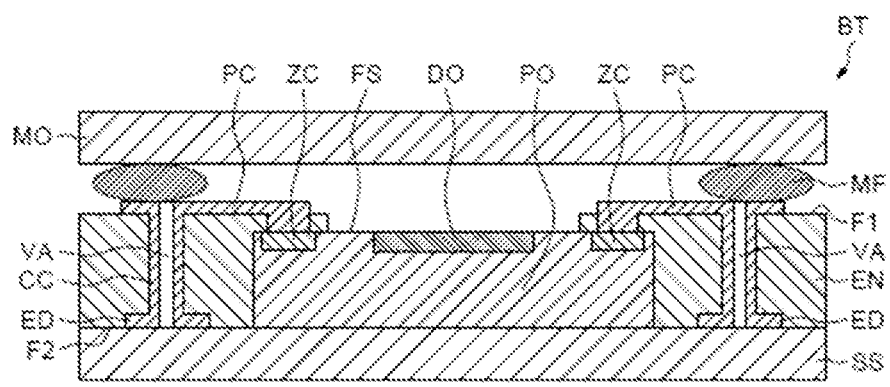
FIG. 1 schematically illustrates a cross-sectional view of an optical package.

FIG. 1 schematically illustrates a cross-sectional view of an optical package BT of an integrated circuit according to one embodiment.

The package BT comprises an electronic integrated circuit chip PO supporting at its upper face FS an optical device DO and connection zones or pads ZC.

The package BT also includes a coating EN coating the chip, and an optical plugging element MO covering the optical device DO and forming a front face of the package BT.

The optical device DO of the chip PO can be, for example, an ambient light sensor of the ALS type. More generally, the optical device DO can be a device that emits and/or receives a luminous flux, for example a laser source.

The coating EN covers the upper face of the chip PO and in particular the connection zones ZC of the chip, while leaving exposed the optical device DO so as to allow an optical coupling with the optical plugging element MO.

The coating has a first face F1 located on the optical device DO side and a second face F2, opposite to the first face, comprising conductive protruding ends ED forming external connection zones of the package.

The package BT could be connected directly onto a printed circuit card for example, via these electric connection zones ED and optional solder balls.

Alternatively, as illustrated in FIG. 1, the second face F2 of the coating EN can be fastened to a support substrate SS, and the protruding ends ED are thus soldered to an interconnection network (not explicitly shown) of the substrate SS.

Electric connections are arranged in the coating EN to electrically connect the contact zones ZC of the chip PO and the protruding ends ED located on the second face F2 of the coating EN.

In this respect the package BT includes vias VA that pass through the coating EN from the first face F1 to the second face F2.

Between the first face F1 and the second face F2 of the coating EN, the vias VA are lined on their inner walls with electrically conductive paths CC, for example made of metal.

On the first face of the coating EN, the electrically conductive paths CC of the vias VA are connected to electrically conductive tracks PC, for example metal, arranged on the surface of the coating up to the connection zones ZC of the chip PO.

In particular, perforations of the coating provided above the connection zones ZC are filled with conductive material to connect the electrically conductive tracks PC to these connection zones.

On the second face of the coating EN, the electrically conductive paths CC of the vias VA are connected to the protruding ends ED.

The electrically conductive paths CC, the electrically conductive tracks PC and the protruding ends ED can be made in the same conductive layer for example metal, made of copper, made of nickel, or made of gold, or in a combination of these three metals.

Moreover, the optical plugging element MO is fastened by a fastening material MF onto the first face of the coating in such a way as to on the one hand protect the optical device DO and on the other hand so as to be optically coupled to the optical device DO.

The optical plugging element MO can be an optically transparent, or filtering, pane of glass, fastened onto the coating EN by the fastening material MF.

For example, the optical plugging element MO could also comprise a scattering pane of glass making a laser source harmless to eyes of observers.

The fastening material MF can be a bead of electrically insulating glue, continuous or not, deposited on the first face of the coating EN, around the optical device DO.

Such an electrically insulating glue is conventional and known per se.

The glue can be in contact with the coating EN and/or with the metal tracks PC.

Figure 2:
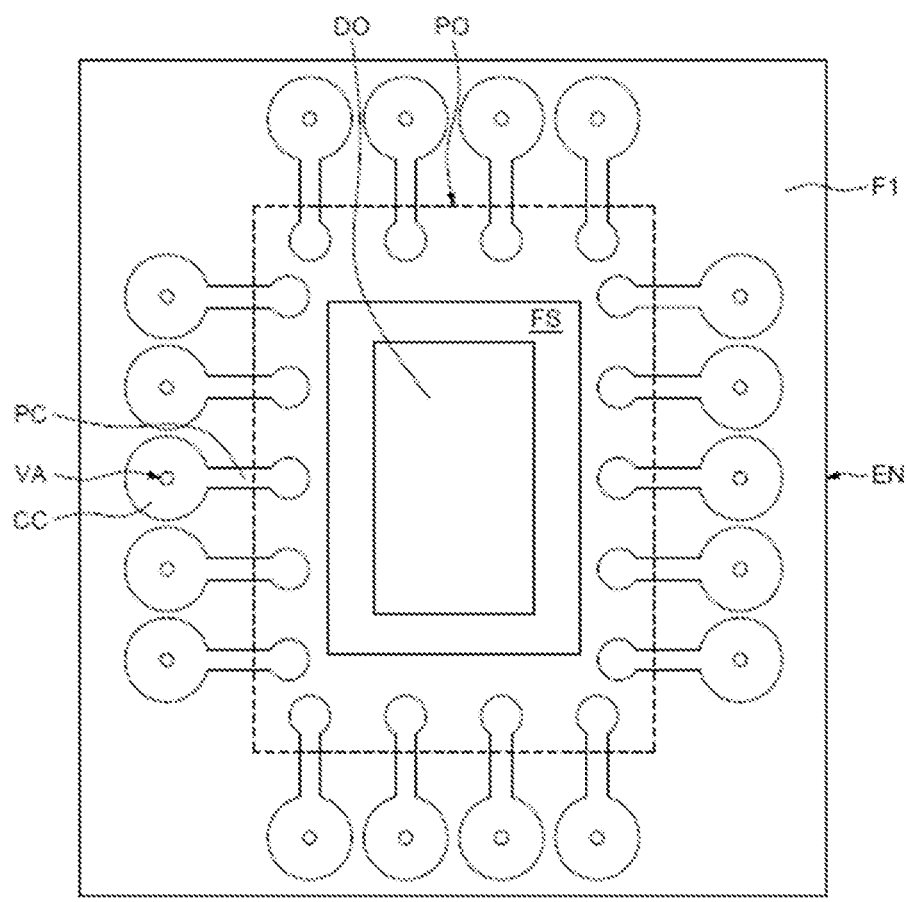
FIG. 2 illustrates a top view of the optical package shown in reference to FIG. 1.

FIG. 2 illustrates a top view of a package BT described in reference to FIG. 1 in which the optical plugging element and the fastening material are not shown, so as to expose the first face F1 of the coating EN, and the electrically conductive tracks PC.

The coating EN partially covers the upper face FS of the electronic chip PO, so as to cover the connection zones (pads) of the chip while leaving free a zone occupied by the optical device DO.

The coating EN comprises a border located around the lateral edges of the chip PO, in which the vias VA are hollowed out perpendicularly to the first face F1 of the coating EN.

Figure 3:
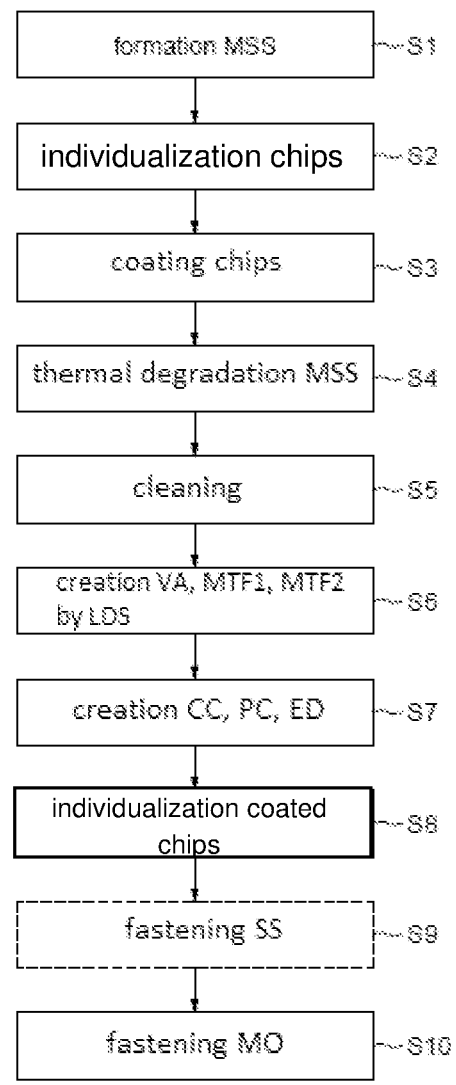
FIG. 3 illustrates steps of a method for manufacturing a package like that described in reference to FIGS. 1 and 2.

FIG. 3 illustrates steps of an example of a method for manufacturing a package like that described above in reference to FIGS. 1 and 2.

The method comprises providing the electronic chip PO supporting the optical device DO and the electric connection zones (pads).

Although providing the electronic chip alone is mentioned here, in practice the method comprises providing a wafer of semiconductor substrate, or slice, for example made of silicon, comprising a set of already manufactured electronic chips PO, ready to be separated or individualized along cutout lines of the slice (a process or technique known in the art as singulating).

The method comprises a formation S1 of a thermally degradable protective layer MSS covering all of the slice and thus the optical device of each electronic chip PO of the slice.

The protective layer MSS is formed from a temporary sacrificial material, thermally destructible, for example the foam REVALPHA No. 3195VS produced by the company NITTO.

The formation of the thermally degradable protective layer MSS above each optical device comprises, for example, a deposit of the protective layer on the entire slice then a photolithography so as to only leave the protective layer above the optical devices DO.

The depositing of the protective layer MSS is, for example, carried out via a spin coater by the use of a rotating support to rotate the slice and through the use of a tool for dispensing the material of the protective layer MSS.

The viscosity of the material of the protective layer MSS, the speed of rotation of the support and the quantity of material deposited allow for dispersion and a control over a final thickness of the protective layer as well as its flatness. Indeed, the thickness and the flatness of the protective layer MSS allow to ensure the quality of the formation of an opening in the coating allowing to expose the optical device DO of the chip PO.

The method then includes a separation or individualization S2 of the electronic chips PO by cutting of the slice along the cutout lines (i.e., singulation).

In step S3, the electronic chips PO are prepared for a formation of the coating EN with a coating material.

The coating material comprises, for example, a resin including primers of metal-organic complexes that can be locally activated, via a method known by the name of Laser Direct Structuring (LDS), to later allow an electroless plating of metal layers on activated parts of the coating.

The step S3 comprises, for example, a turning over of the chips, then a gluing of the protective layer MSS of each chip PO onto a plastic film.

It is advantageously possible to maintain a controlled distance between the chips to take into account a retraction of the coating resin after drying. Moreover, the plastic film is provided to have an adherence that is reduced during a heat treatment.

Once the chips have been glued, the step S3 comprises a molding of the coating material so as to form a slice of coating material connecting the chips PO to each other.

The formation of the insulating coating EN comprises, for example, an application of a pressure onto the coating material to fill in interstices, so as to in particular form the first face F1 of each coating EN covering the connections zones (pads) of each chip PO.

The step S3 then comprises a first heat treatment to solidify the coating resin.

The first heat treatment comprises heating of the coating resin, for example to a temperature between 150-160 degrees Celsius so as to polymerize it.

In this example, the protective layer MSS starts to degrade at the same time that the coating resin solidifies, but this beginning of degradation is not harmful here because of the absence of movement of the slice.

That being said, the method then advantageously comprises, in step S4, a completion of the thermal degradation of the protective layer MSS allowing to expose each optical device DO.

This thermal degradation S4 of the protective layer MSS can be carried out by a second heat treatment including a heating of the slice, for example, to a temperature of approximately 180 degrees Celsius. During this second heat treatment, the protective layer MSS completely disintegrates but the polymerized coating resin is not affected.

After the step of thermal degradation S4, the package BT undergoes a cleaning S5, for example with water, in particular to clean the optical device DO on the chip PO.

Then, there is a creation of the electric connections including the metal tracks PC, the vias lined with the conductive tracks CC and the protruding ends ED.

The creation of the electric connections can be implemented in two stages, for example by a method associating electroless plating and laser direct structuring.

First, the creation of the connections comprises, for example, a creation S6 of the vias, and of first patterns MF1 and second patterns MTF2 using, for example, a direct-structuring laser.

The creation S6 of the vias VA comprises a hollowing out of through-holes in the coating EN, extending from the first face to the second face of the coating EN.

The creation S6 of the first patterns MTF1 comprises an etching of the resin at the location of the future electrically conductive tracks PC on the first face of the coating EN, so that the first patterns extend from the vias VA to the electric connection zones ZC.

The creation S6 of the second patterns MTF2 comprises an etching of the resin at the location of the future protruding ends ED on the second face of the coating EN, so that the second patterns extend from the vias VA on the second face F2.

Then in step S7 the electrically conductive paths CC, the electrically conductive tracks PC, and the protruding ends ED are created by electroless plating, for example by an immersion of the slice in an electroless plating bath.

Once the electric connections have been made, the method then includes a sawing S8 of the slice according to cutout paths, in such a way as to individualize each chip PO coated in its coating EN (again, this process referred to as singulating).

The method can further include an optional fastening S9 of a support substrate SS under the coating EN.

The fastening S9 of the support substrate onto the second face of the coating EN comprises, for example, a soldering of the protruding ends ED to an interconnection network of the substrate SS.

A fastening S10 of the optical plugging element onto the first face of the coating EN by use of the fastening material MF is also provided, so as to allow an optical coupling between the optical plugging element MO and the optical device DO.

The fastening of the optical plugging element can comprise dispensing a bead of insulating glue around the optical device DO, for example on the first face of the coating EN, optionally on electrically conductive tracks PC.

The invention is not limited to the implementations and embodiments that have just been described.

Figure 4:
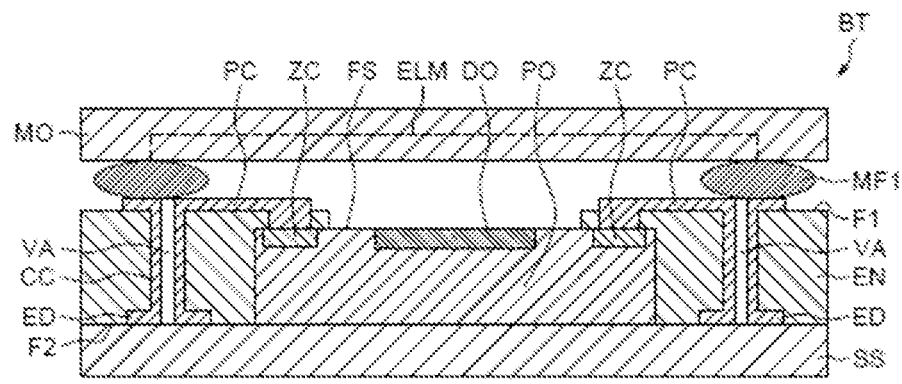
FIG. 4 schematically illustrates a cross-sectional view of an optical package.

Thus, as illustrated schematically in FIG. 4, optionally, the package BT can be provided with a conductive element ELM allowing to verify the integrity of the optical plugging element MO.

The optical plugging element MO can be, for example, a pane of glass comprising the electrically conductive element, for example a conductive wire ELM weaving through the pane of glass.

Alternatively, the electrically conductive element formed by wire ELM could wind on the surface of the pane of glass.

The electrically conductive element is connected to the chip by spots of conductive glue MF1 disposed on different portions of electrically conductive paths PC, thus creating an electrically conductive path.

Figure 5:
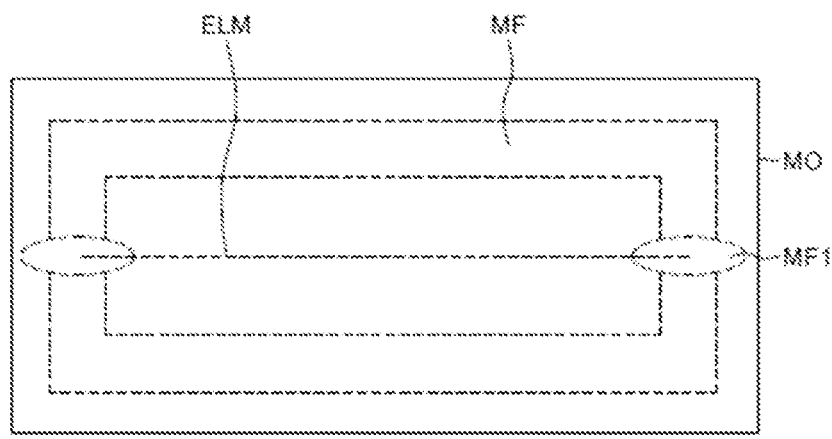
FIG. 5 illustrates a top view of the optical package shown in reference to FIG. 4.

As illustrated more particularly in FIG. 5 which is a top view of the optical plugging element, the fastening of the optical plugging element MO onto the coating and the conductive tracks can be completed by a bead of insulating glue MF disposed between the spots of electrically conductive glue MF1.

The two tracks respectively electrically connected to the electrically conductive element are also respectively connected, for example, to a source of current allowing to inject a current into the electrically conductive element wire ELM, and to a device (such as a circuit) for detecting current.

The source of current and the current detecting device can be incorporated into the chip or be disposed outside the package.

If the chip detects the presence (non-interruption of the current) of the electrically conductive path (interruption of the current), this indicates that the integrity of the optical plugging element MO is respected.

If on the contrary the chip detects an interruption of this electrically conductive path then this indicates that the optical plugging element is broken or detached and thus that the integrity of the optical plugging element MO is no longer respected.

Of course, in this embodiment, step S10 of FIG. 3 also includes the formation of the two volumes of conductive glue MF1 between the insulating glue MF as well as an antecedent step for making the optical plugging element MO in a manner where it includes the electrically conductive element wire ELM.

The invention claimed is:

1. A method for manufacturing an optical package which includes an electronic integrated circuit chip supporting an optical device and electric connection zones, comprising:
    forming a thermally degradable protective layer covering the optical device;
    forming an insulating coating that coats the electronic integrated circuit chip while covering said electric connection zones but not covering said thermally degradable protective layer;
    applying a thermal treatment to degrade the thermally degradable protective layer and expose the optical device;
    creating via openings passing through the insulating coating from a first face to a second face opposite to the first face;
    creating first patterns arranged on the first face of the insulating coating and extending from the via openings to the electric connection zones;
    creating second patterns on the second face of the insulting coating extending from said via openings;
    forming electrically conductive paths in the via openings;
    forming electrically conductive tracks in the first and second patterns;
    wherein the electrically conductive tracks electrically connect the electrically conductive paths to the electric connection zones of the electronic integrated circuit chip at the first face of the insulating coating and form protruding structures at the second face of the insulating coating; and
    fastening an optical plugging element at least partly onto the first face of the insulating coating in a position supporting an optical coupling between the optical plugging element and the optical device.

2. The method according to claim 1, wherein creating via openings and creating the first and second patterns is carried out by application of a direct-structuring laser.

3. The method according to claim 2, wherein forming the electrically conductive paths and electrically conductive tracks comprises performing an electroless plating.

4. The method according to claim 1, further comprising fastening a support substrate onto the second face of the insulating coating.

5. The method according to claim 4, further comprising electrically connecting the protruding structures at the second face of the insulating coating to the support substrate.

6. The method according to claim 5, wherein the support substrate includes an interconnection network which is electrically connected to the protruding structures.

7. The method according to claim 1, further comprising forming said optical plugging element to include an electrically conductive element, and wherein fastening the optical plugging element further comprises electrically connecting ends of the electrically conductive element to the electrically conductive tracks.

8. The method according to claim 7, wherein fastening comprises using an electrically conductive adhesive.

9. The method according to claim 1, wherein the optical plugging element is a pane of material that is one or more of optically transparent, filtering and polarizing.

10. The method according to claim 1, wherein the optical device is an integrated circuit configured to perform one or more of the following: emit luminous flux and receive luminous flux.

11. The method according to claim 1, wherein the optical device is an ambient light sensor.

12. An optical package, comprising:
    an electronic integrated circuit chip supporting an optical device and electric connection zones;
    an insulating coating that coats the electronic integrated circuit chip by covering the electric connection zones and peripheral sides of the electronic integrated circuit chip while leaving the optical device exposed;

a pane of optically transparent material at least partly fastened onto a first face of the insulating coating and optically coupled to the optical device; and vias passing through the insulating coating from said first face to a second face opposite to the first face, each via having an electrically conductive path that is connected at a first end to the electric connection zones of the electronic integrated circuit chip by electrically conductive tracks arranged on the first face of the insulating coating and having a second end at the second face of the insulating coating;

wherein said pane of optically transparent material includes a wire extending from a first end to a second end over the optical device;

a bead of an electrically insulating glue located at least partly around the optical device to fasten the pane of optically transparent material onto the first face of the insulating coating; and spots of conductive glue that electrically connect the first and second ends of the wire to the electrically conductive tracks arranged on the first face of the insulating coating.

13. The package according to claim 12, further comprising a support substrate at least partly fastened onto the second face of the insulating coating, wherein the second ends of the electrically conductive paths for the vias are electrically connected to the support substrate.

14. The package according to claim 13, wherein the support substrate includes an interconnection network that is electrically connected to said second ends of the electrically conductive paths.

15. The package according to claim 12, wherein the pane of optically transparent material is one or more of filtering and polarizing.

16. The package according to claim 12, wherein the optical device is an integrated circuit configured to perform one or more of the following: emit luminous flux and receive luminous flux.

17. The package according to claim 12, wherein the optical device is an ambient light sensor.

18. The package according to claim 12, wherein the wire weaves through said pane of optically transparent material between the first end and the second end.

19. The package according to claim 12, wherein the wire winds on a surface of said pane of optically transparent material between the first end and the second end.

* * * * *